United States Patent
Ikeya

(10) Patent No.: US 8,768,545 B2
(45) Date of Patent: Jul. 1, 2014

(54) ARTICLE TRANSPORT FACILITY AND ARTICLE TRANSPORTING METHOD

(75) Inventor: Masayuki Ikeya, Komaki (JP)

(73) Assignee: Daifuku Co., Ltd., Osaka (JP)

( * ) Notice: Subject to any disclaimer, the term of this patent is extended or adjusted under 35 U.S.C. 154(b) by 294 days.

(21) Appl. No.: 13/318,900

(22) PCT Filed: Apr. 23, 2010

(86) PCT No.: PCT/JP2010/057222

§ 371 (c)(1), (2), (4) Date: Jan. 10, 2012

(87) PCT Pub. No.: WO2010/131558

PCT Pub. Date: Nov. 18, 2010

(65) Prior Publication Data

US 2012/0101667 A1  Apr. 26, 2012

(30) Foreign Application Priority Data

May 11, 2009 (JP) ................................. 2009-114838

(51) Int. Cl.
  *G05D 3/00* (2006.01)
(52) U.S. Cl.
  USPC ......................................................... 701/19
(58) Field of Classification Search
  None
  See application file for complete search history.

(56) References Cited

U.S. PATENT DOCUMENTS

| | | | |
|---|---|---|---|
| 4,361,202 A | * | 11/1982 | Minovitch .................... 180/168 |
| 5,267,173 A | | 11/1993 | Tanizawa et al. |
| 5,306,402 A | | 4/1994 | Frembgen |
| 6,799,521 B2 | | 10/2004 | Tai et al. |
| 6,931,996 B2 | | 8/2005 | Matsukawa |
| 2006/0011492 A1 | | 1/2006 | Moeckl |
| 2008/0055103 A1 | | 3/2008 | Koide |

FOREIGN PATENT DOCUMENTS

| | | |
|---|---|---|
| CN | 1343594 A | 4/2002 |
| CN | 1468767 A | 1/2004 |
| CN | 101140470 A | 3/2008 |
| DE | 4227005 A1 | 2/1994 |
| JP | 62140106 A | 6/1987 |
| JP | 4160413 A | 6/1992 |
| WO | 02090030 A1 | 11/2002 |
| WO | 03082504 A1 | 10/2003 |

\* cited by examiner

*Primary Examiner* — Tomas Tarcza
*Assistant Examiner* — Garrett Evans
(74) *Attorney, Agent, or Firm* — The Webb Law Firm

(57) ABSTRACT

An article transport facility in which movable bodies can merge into a merging portion while preventing collisions between the movable bodies. A communication relay device is provided to each of the first merging path, the second merging path, and the post-merging path. Each communication relay device includes an antenna portion, a relay device main body that associates movable body information obtained by communicating with the movable body communication devices using the antenna portion with identification information which indicates which one of the paths the antenna portion that received the movable body information is provided to, and that is capable of communicating the information thus obtained to the managing means. The managing means determines in which path the movable body exists to manage operations of a plurality of movable bodies based on said body information and identification information which are received from said main body.

13 Claims, 8 Drawing Sheets

Fig.5
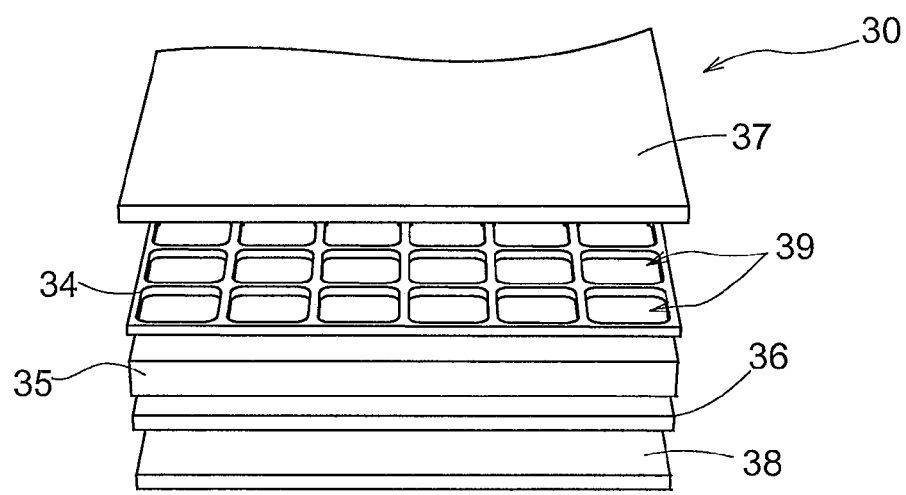
(a)
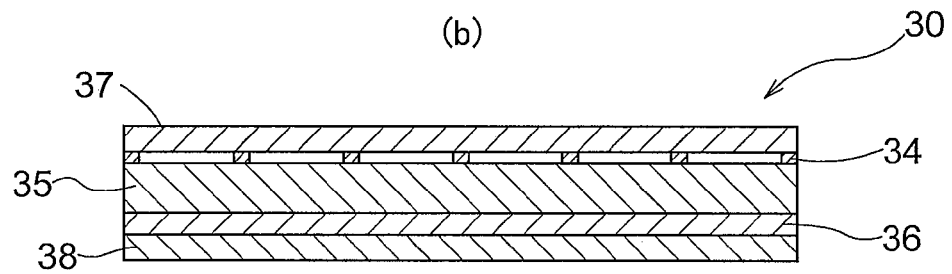
(b)

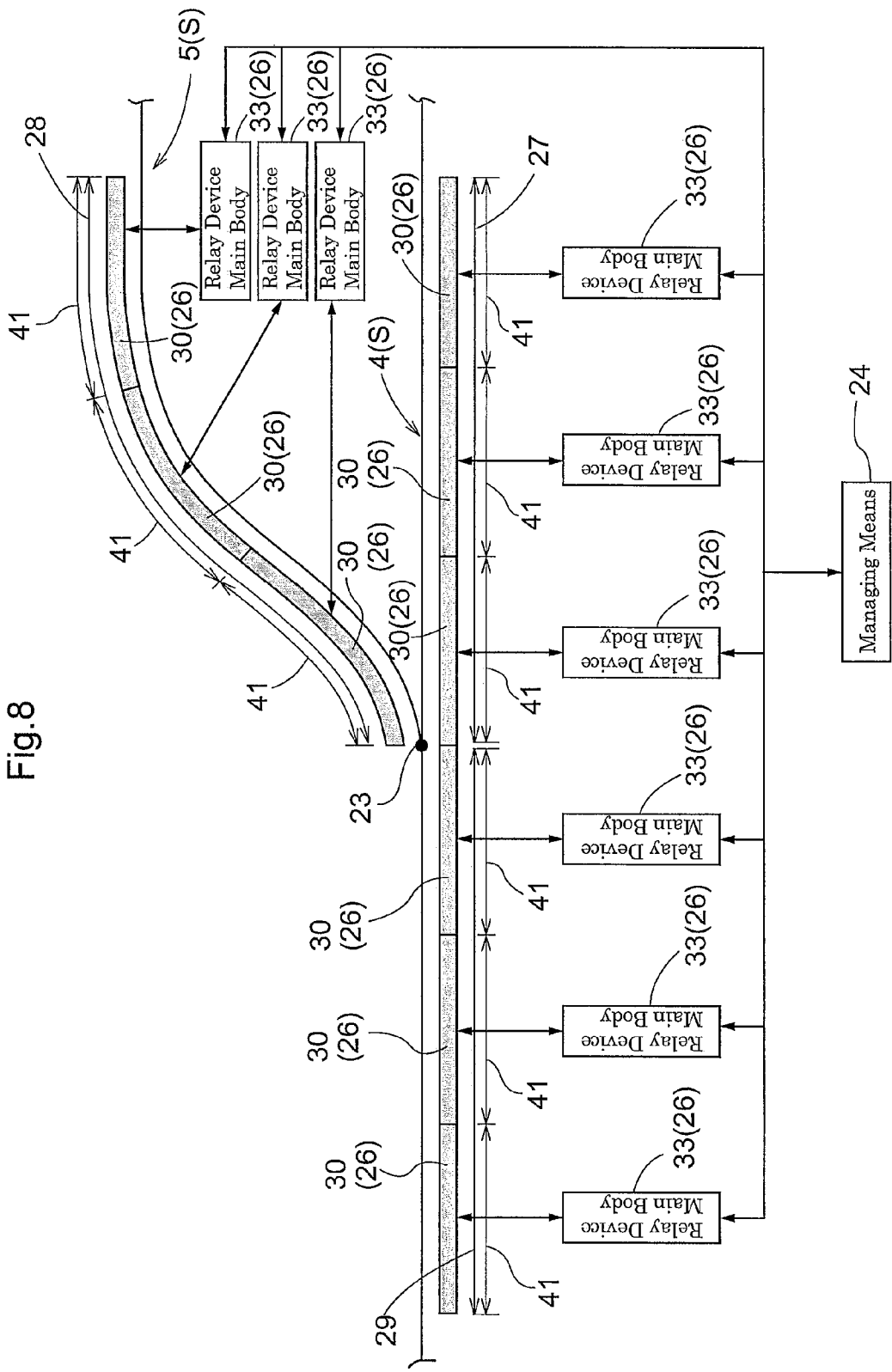

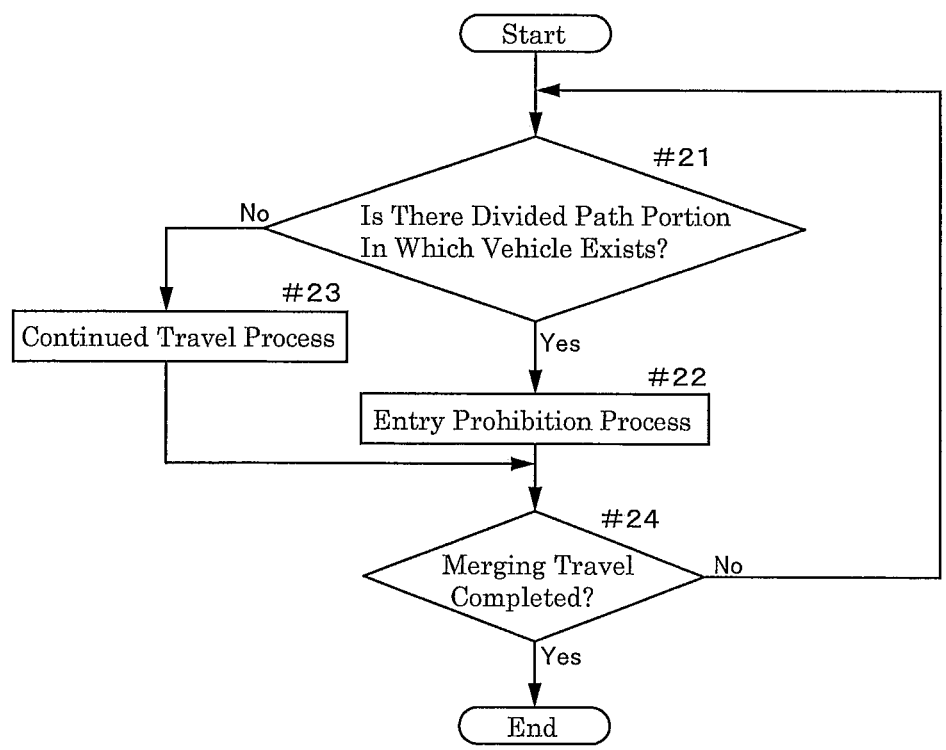

ARTICLE TRANSPORT FACILITY AND ARTICLE TRANSPORTING METHOD

TECHNICAL FIELD

The present invention relates to an article transport facility that comprises a travel path including at least a first path and a second path, a plurality of movable bodies which travel along the travel path for transporting articles, a communication relay device for communicating wirelessly with a movable body communication device provided to each of the plurality of movable bodies, managing means for issuing operation command information to each of the plurality of movable bodies through wireless communication between the communication relay device and the movable body communication device to manage operations of the plurality of movable bodies at a merging portion at which the first path and the second path merge with each other wherein each of the plurality of movable bodies includes travel control means for controlling travel of the movable body based on the operation command information from the managing means received by the movable body communication device.

BACKGROUND ART

In such an article transport facility, since the movable bodies may collide with each other if the movable bodies are allowed to travel from both the first path and the second path into the merging portion, the movable bodies need to be caused to travel into the merging portion while preventing a collision between the movable body that merge into the merging portion from the first path and the movable body that merges into the merging portion from the second path.

To this end, in a conventional article transport facility, a first merging detecting sensor is provided for detecting whether there is any movable body entering a first merging path that extends from the first path to the merging portion. By communicating the detected information from the first merging detecting sensor to the managing means and by communicating entering information to the managing means from the vehicle that has entered the second merging path extending from the second path to the merging portion, if the managing means determines that there are vehicles that are entering both the first merging path and the second merging path, it issues an operation command information to one of the vehicles to stop its travel to prevent a collision. (See, for example, Patent Document 1.)

In the facility described in Patent Document 1, since the entry of the movable body is detected by the first merging detecting sensor when allowing a movable body entering the first merging path to travel and merge through the first merging path into the merging portion, the managing means issues this first path entering information to the movable body that has entered the second merging path, as operation command information. The managing means continually issues this first path entering information as operation command information until after a predetermined amount time allowed for the movable bodies to complete the merging movements has elapsed. Thus, when a movable body merges into the merging portion through the first merging path, the movable bodies are prevented from colliding with each other by stopping the movable body that has entered the second merging path.

Also, when a movable body enters the second merging path, second path entering information which indicates that the movable body has entered the second merging path is communicated to the managing means. The managing means issues, as operation command information, information obtained by putting together the second path entering information and first entering presence information that indicates whether the first path entering information is detected by the first merging detecting sensor, to each of the movable bodies entering the first and second merging paths. And the managing means continually issues this operation command information obtained by putting together the second path entering information and the first entering presence information until after a predetermined amount time allowed for the movable body to complete the merging travel has elapsed. Thus, if travel controlling means of the movable body that has entered the second merging path determines that a movable body has entered the first merging path based on the first entering presence information, it causes the movable body to stop to prevent a collision between the movable bodies. And if the travel controlling means determines that no movable body has entered the first merging path based on the first entering presence information, it causes the movable body to travel and merge.

PRIOR ART DOCUMENT

Patent Documents

Patent Document 1: Japanese Patent Application Publication No. 2002-351543

SUMMARY OF THE INVENTION

Problems to be Solved by the Invention

With the facility described in the above-mentioned Patent Document 1, the managing means determines if there is any movable body that has entered the first merging path and if there is any movable body that has entered the second merging path by receiving the detected information from the first merging detecting sensor and the second path entering information from a movable body. And once the managing means issues the operation command information to cause a vehicle to perform a merging travel in which the vehicle travels through the merging portion from the first merging path or the second merging path, the managing means prevents a collision between movable bodies by not allowing next movable body to merge until after an amount of time allowed for the movable body to finish traveling through the merging portion and to complete the merging travel has elapsed.

However, that the movable body has completed the merging travel is determined based solely on the elapse of the time period; thus, if the movable body stops abnormally due to a mechanical failure etc. during the merging travel, it is determined based on the elapse of the time period that the movable body has completed the merging, and the next vehicle is caused to start a merging travel despite the fact that the movable body has not actually completed the merging travel, as a result of which a collision of the movable bodies may occur.

In addition, for example, when an operator uses a remote control device which can provide a travel command to a movable body to manually cause the movable body which had stopped abnormally to travel, there are times when the movable body which had stopped abnormally is caused to travel in the direction that is opposite from the traveling direction and to enter the merging portion from the downstream side of the merging portion with respect to the travel direction. In this case, the managing means cannot detect the movable body which was manually caused to enter the merging portion, and a collision may occur with a movable body that has been caused to perform a merging travel or with a next movable body that is caused to perform a merging travel.

There are times when the managing means is activated due to a failure or at the beginning of an operation. And if a movable body has stopped midway through the first merging path or the second merging path at the time of the activation, the managing means cannot recognize the stopped movable body; thus, the next movable body which is caused to perform a merging travel may collide with it. While this collision can be prevented by inputting information that indicates that a movable body has stopped midway through the path into the managing means, this inputting operation is burdensome.

The present invention is made in light of such issues, and an object is to provide an article transport facility in which movable bodies can be caused to merge into the merging portion while preventing the movable bodies from colliding with each other.

Means for Solving the Problems

To attain this object, an article transport facility in accordance with the present invention comprises: a travel path including at least a first path and a second path; a plurality of movable bodies which travel along the travel path for transporting articles; a communication relay device for communicating wirelessly with a movable body communication device provided to each of the plurality of movable bodies; managing means for issuing operation command information to each of the plurality of movable bodies through wireless communication between the communication relay device and the movable body communication device to manage operations of the plurality of movable bodies at a merging portion at which the first path and the second path merge with each other; wherein each of the plurality of movable bodies includes travel control means for controlling travel of the movable body based on the operation command information from the managing means received by the movable body communication device. The communication relay device is individually provided to each of a first merging path that extends from the primary path to the merging portion, a second merging path that extends from the secondary path to the merging portion, and a post-merging path that includes the merging portion and extends subsequent to merging at the merging portion. And each said communication relay device includes an antenna portion that is provided along the first merging path, the second merging path, or the post-merging path and that is capable of communicating information wirelessly with the movable body communication device, and a relay device main body to which the antenna portion is connected through a connection line and which is capable of communicating information with the managing means through a communication line. The antenna portion is a sheet-shaped antenna that is formed to be long and to have a sheet-shape and a flat plate shaped cross-section and that forms a communication enabled region over an entire surface of the antenna portion. The relay device main body is configured to associate movable body information obtained using the antenna portion through communication with the movable body communication device with identification information that indicates which one of the first merging path, the second merging path, and the post-merging path the antenna portion that received the movable body information is provided to, and to communicate information thus obtained to the managing means. And the managing means is configured to determine which one of the first merging path, the second merging path, and the post-merging path the movable body exists in, based on the movable body information and the identification information which are received from the relay device main body to control operations of the plurality of movable bodies.

An article transporting method corresponding to the above includes a travel path including at least a first path, a second path, and a merging portion at which the first path and the second path merge with each other, a plurality of movable bodies which are configured to travel along the travel path to transport articles, and each of which includes a vehicle communication device and travel control means, managing means for managing operation of each of the plurality of movable bodies in order to manage operations of the plurality of movable bodies at least at the merging portion, and a communication relay device individually provided to each of a first merging path that extends from the first path to the merging portion, a second merging path that extends from the second path to the merging portion, and a post-merging path that includes the merging portion and extends subsequent to merging at the merging portion.

Each said communication relay device includes an antenna portion that is provided along the first merging path, the second merging path, or the post-merging path and that is capable of communicating information wirelessly with the movable body communication device, and a relay device main body to which the antenna portion is connected through a connection line and which is capable of communicating information with the managing means through a communication line. The antenna portion is a sheet-shaped antenna that is formed to be long and to have a sheet-shape and a flat plate shaped cross-section and that forms a communication enabled region over an entire surface of the antenna portion. And the article transporting method comprises causing the relay device main body to associate movable body information obtained using the antenna portion through communication with the movable body communication device with identification information that indicates which one of the first merging path, the second merging path, and the post-merging path the antenna portion that received the movable body information is provided to, and to communicate information thus obtained to the managing means; causing the managing means to determine which one of the first merging path, the second merging path, and the post-merging path the movable body exists in, based on the movable body information and the identification information which are received from the relay device main body, to generate operation command information, and to issue operation command information to at least one of the plurality of movable bodies through wireless communication between the said communication relay device and the said movable body communication device; and causing the travel control means to control travel of at least one of the movable bodies based on the operation command information from the managing means received by the movable body communication device.

With such configuration or method, if a movable body exists in any of the first merging path, the second merging path, or the post-merging path, the travel control means provided to the movable body transmits movable body information (for example, information that identifies the movable body) to the communication relay device by the movable body communication device. The communication relay device can receive the movable body information from the movable body because the communication relay device is individually provided to each of the first merging path, the second merging path, and the post-merging path, and because the antenna portion which is a sheet-shaped antenna is arranged along the paths. The relay device main body of the communication relay device associates the movable body information with the identification information that indicates which one of the first merging path, the second merging path, and the post-merging path the antenna portion that received the movable body information is provided to, and communicates the movable body information and the identification information to the managing means. Thus, because the managing means receives the movable body information and the identification information from the relay device main body, it can determine in which one of the first merging path, the second merging path, and the post-merging paths the movable body exists.

Therefore, since the managing means can recognize that the movable bodies have entered both the first merging path and the second merging path, a collision between the movable bodies can be prevented by issuing operation command information for stopping the travel to one of the movable bodies. And even when a movable body was caused to start a merging travel, the managing means can determine whether a movable body exists in the path to be traveled by the movable body. Therefore, even if a movable body was manually caused to enter the post-merging path, for example, the managing means can recognize the entrance by the movable body, and can prevent a collision between the movable bodies by issuing operation command information for stopping the travel to the movable body that was caused to start the merging travel.

And even if a movable body has stopped at an intermediate location from the first path or the second path to the merging portion when the managing means is activated due to a failure or at the beginning of an operation, the travel control means provided to the vehicle can transmit movable body information to the communication relay device by means of the movable body communication device. Therefore, since the managing means can receive the movable body information and the identification information from the movable body that has stopped midway through the path, the managing means can recognize that the movable body has stopped midway through the path without having to input into the managing means any information that indicates that a movable body has stopped midway through the path. Therefore, a collision between movable bodies caused by allowing a next vehicle to perform a merging travel can be prevented in advance.

Thus, an article transport facility can be provided in which movable bodies can be caused to merged into the merging portion while preventing the movable bodies from colliding with each other.

In the embodiment of the article transport facility in accordance with the present invention, when the movable body to which the travel control means is provided enters the first merging path or the second merging path, the travel control means preferably causes the movable body communication device to transmit merging travel request information for requesting a merging travel into the merging portion from the first path or the second path to the communication relay device, wherein when the managing means receives the merging travel request information, if the managing means determines that no other movable body exists in the path to be traveled during the merging travel and that there is no movable body which was caused to start a merging travel earlier, the managing means is preferably configured to issue a merging travel command for commanding a merging travel as the operation command information to the movable body that transmitted the merging travel request information, and to issue a passage entry prohibition command for prohibiting entry into the path to be traveled to another movable body as the operation command information, wherein if the managing means determines that a movable body exists in the path to be traveled during the merging travel or that there is a movable body which was caused to start a merging travel earlier, the managing means is preferably configured to issue a merging travel prohibition command which prohibits a merging travel to the movable body that transmitted the merging travel request information as the operation command information.

The article transporting method corresponding to the above, preferably comprises causing the travel control means to generate merging travel request information for requesting a merging travel from the first path or the second path to the merging portion when the movable body to which the travel control means is provided enters the first merging path or the second merging path, and to transmit the merging travel request information to the communication relay device by the movable body communication device wherein the step of causing the managing means to issue operation command information includes: when the managing means receives the merging travel request information, if the managing means determines that no other movable body exists in the path to be traveled during the merging travel and that there is no movable body which was caused to start a merging travel earlier, causing the managing means to issue a merging travel command for commanding a merging travel as the operation command information to the movable body that transmitted the merging travel request information, and to issue a passage entry prohibition command for prohibiting entry into the path to be traveled to another movable body as said operation command information, and if the managing means determines that a movable body exists in the path to be traveled during the merging travel or that there is a movable body which was caused to start a merging travel earlier, causing the managing means to issue a merging travel prohibition command which prohibits a merging travel to the movable body that transmitted the merging travel request information as the operation command information.

With such configuration or method, if a movable body enters the first merging path or the second merging path, the managing means can recognize that the movable body entered the first merging path or the second merging path because the managing means receives the merging travel request information from the movable body. And the managing means can determine if another movable body exists in the path to be traveled during the merging travel, and if there is a vehicle that was caused to start a merging travel earlier based on whether the movable body information and the identification information have been received from another movable body. Thus, if the managing means determines that no other movable body exists in the path to be traveled during the merging travel, and that there is no vehicle that was caused to start a merging travel earlier, the managing means determines that the merging travel is possible, and issues the merging travel command to the movable body that entered the first merging path or the second merging path, and issues the passage entry prohibition command to other movable bodies to prevent a collision between the movable bodies. In addition, if the managing means determines that another movable body exists in the path to be traveled during the merging travel, and that there is a vehicle that was caused to start a merging travel earlier, it determines that the merging travel is not possible, and issues the merging travel prohibition command to the movable body that entered the first merging path or the second merging path to prevent a collision between the movable bodies.

Therefore, a collision between the movable bodies can be prevented reliably because whether the merging travel is possible can be determined at the time a movable body enters the first merging path or the second merging path without allowing a collision between the movable bodies to occur.

In the embodiment of the article transport facility in accordance with the present invention, when a movable body exists that is performing a merging travel, if the managing means determines that another movable body exists in the path to be traveled during the merging travel of the movable body, the managing means is preferably configured to issue a travel stop command for stopping travel as the operation command information to the vehicle that is performing the merging travel.

In the article transporting method corresponding to the above, the step of causing the managing means to issue operation command information preferably includes: when a movable body exists that is performing a merging travel, if the managing means determines, that another movable body exists in the path to be traveled during the merging travel of the movable body, causing the managing means to issue a travel stop command for stopping travel as the operation command information to the vehicle that is performing the merging travel.

With such configuration or method, when a movable body is performing a merging travel, the managing means can determine whether another movable body exists in the path to be traveled based on whether the movable body information and identification information have been received from another movable body. Thus, even if a movable body was manually caused to enter the path to be traveled, for example, the managing means can recognize the entrance of another movable body into the path to be traveled; thus, a collision between the movable bodies can be prevented by issuing the travel stop command to the movable body that is performing the merging travel.

In the embodiment of the article transport facility in accordance with the present invention, when the vehicle that started a merging travel earlier has not reached the merging portion, if the managing means receives the merging travel request information from a movable body that has priority to merge over the movable body that started the merging travel, the managing means is preferably configured to issue a travel stop command for stopping travel as the operation command information to the vehicle that started the merging travel earlier and to issue a merging travel command as the operation command information to the movable body that has priority to merge.

In the article transporting method corresponding to the above, the step of causing the managing means to issue operation command information includes: when the vehicle that started a merging travel earlier has not reached the merging portion, if the managing means receives the merging travel request information from a movable body that has priority to merge over the movable body that started the merging travel, causing the managing means to issue a travel stop command for stopping travel as the operation command information to the vehicle that started the merging travel earlier and to issue a merging travel command as the operation command information to the movable body that has priority to merge.

With such configuration or method, even if there is a vehicle that started a merging travel earlier, if the movable body has not reached the merging portion, the managing means issues the travel stop command to the vehicle that started the merging travel earlier to stop the vehicle, and issues the merging travel command to the movable body that has priority to merge to allow it to merge. Thus, even if there is a vehicle that started a merging travel earlier, if there is a movable body that has priority to merge over the movable body that started a merging travel earlier, the latter movable body can be given priority to merge without allowing a collision to occur between the movable bodies. Here, a priority to merge may be assigned to, for example, a vehicle that is traveling or is to travel in the first path over a movable body that is traveling or is to travel in the second path. Also, the priority to merge may be given to a movable body whose a destination is farther from the merging portion in the travel direction than the destination of a movable body that was caused to start the merging travel earlier. As a result, a plurality of movable bodies can travel efficiently, which contributes to an improvement of transporting capacity of the article transport facility while preventing a collision between the movable bodies.

In the embodiment of the article transport facility in accordance with the present invention, at least one of the first merging path, the second merging path, and the said post-merging paths is preferably divided into a plurality of divided path portions, wherein the communication relay device is preferably individually provided to each of the plurality of divided path portions, wherein the relay device main body is preferably configured to associate movable body information obtained using the antenna portion through communication with the movable body communication device with division identification information that indicates which one of the divided path portions the antenna portion that received the movable body information is provided to, and to communicate information thus obtained to the managing means, and wherein the managing means is preferably configured to determine which one of the divided path portions the movable body exists in, based on the movable body information and the division identification information which are received from the relay device main body to control operations of the plurality of movable bodies.

In the article transporting method corresponding to the above, at least one of the first merging path, the second merging path, and the said post-merging paths is preferably divided into a plurality of divided path portions, wherein the communication relay device is preferably individually provided to each of the plurality of divided path portions, wherein the step of causing the relay device main body to transmit to the managing means includes: causing the relay device main body to associate movable body information obtained using the antenna portion through communication with the movable body communication device with division identification information that indicates which one of the divided path portions the antenna portion that received the movable body information is provided to, and to communicate information thus obtained to the managing means, and wherein the step of causing the managing means to issue operation command information preferably includes: causing the managing means to determine which one of the divided path portions the movable body exists in, based on the movable body information and the division identification information which are received from the relay device main body to generate operation control information based on this determination.

With such configuration or method, because the managing means receives the movable body information and the division identification information, the managing means can determine whether a movable body exists for each divided path portion, which is a unit into which at least one of the first merging path, the second merging path, and the said post-merging paths is divided. Therefore, because the managing means can manage operations of a plurality of movable bodies such that, for example, only one movable body may be allowed to enter a divided path portion, a collision between the movable bodies can be prevented even if a number of movable bodies are allowed to enter the path or paths among the first merging path, the second merging path, and the post-merging path that is or are divided into the plurality of divided path portions. Therefore, a collision between the movable bodies can be prevented while allowing the movable bodies to be closer together when performing a merging travel, thus to perform merging travel efficiently.

In the embodiment of the article transport facility in accordance with the present invention, the managing means is preferably configured to issue an entry prohibition command for prohibiting entry into the divided path portion in which the movable body exists as the operation command information to each of the plurality of movable bodies.

In the article transporting method corresponding to the above, the step of causing the managing means to issue operation command information preferably includes causing the managing means to issue an entry prohibition command for prohibiting entry into the divided path portion in which the movable body exists as the operation command information to each of the plurality of movable bodies.

With such configuration or method, because, if a movable body exists in a divided path portion, the managing means issues an entry prohibition command to other movable bodies, a collision between the movable bodies can be reliably prevented.

In the embodiment of the article transport facility in accordance with the present invention, the travel path is preferably defined by a rail, and the antenna portion is preferably arranged along a longitudinal direction of the rail such that the antenna portion is supported by the rail.

In addition, the rail is preferably supported by a ceiling, wherein the movable body preferably includes a travel drive portion configured to travel along the rail, and the article support portion supported by the travel drive portion such that the article support portion is located below the rail, wherein the antenna portion is preferably located on a surface that faces the article support portion of the rail, and wherein a vehicle side antenna portion which communicates with the antenna portion is preferably provided to the article support portion.

BRIEF DESCRIPTION OF THE DRAWINGS

FIG. 5 is an exploded perspective view and a sectional view showing an antenna portion,
FIG. 8 is a plan view of important portions of an article transport facility in accordance with the second embodiment,
and
FIG. 9 is a flow chart that shows operations of the managing means in accordance with the second embodiment.

BEST MODES FOR CARRYING OUT THE INVENTION

First Embodiment

Preferred embodiments of an article transport facility in accordance with the present invention are described next with reference to the drawings.

Figure 1:
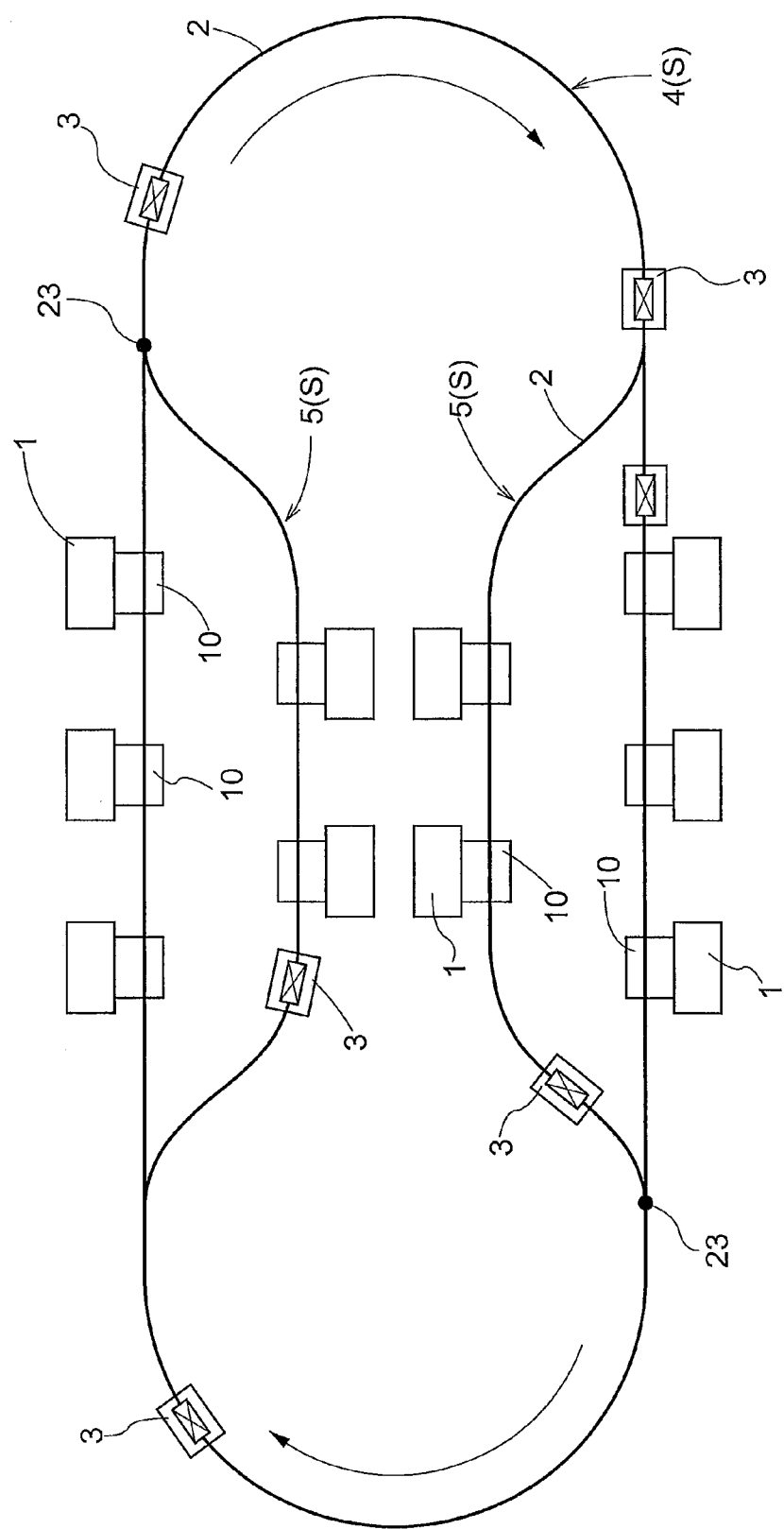
FIG. 1 is a plan view of an article transport facility.
Figure 2:
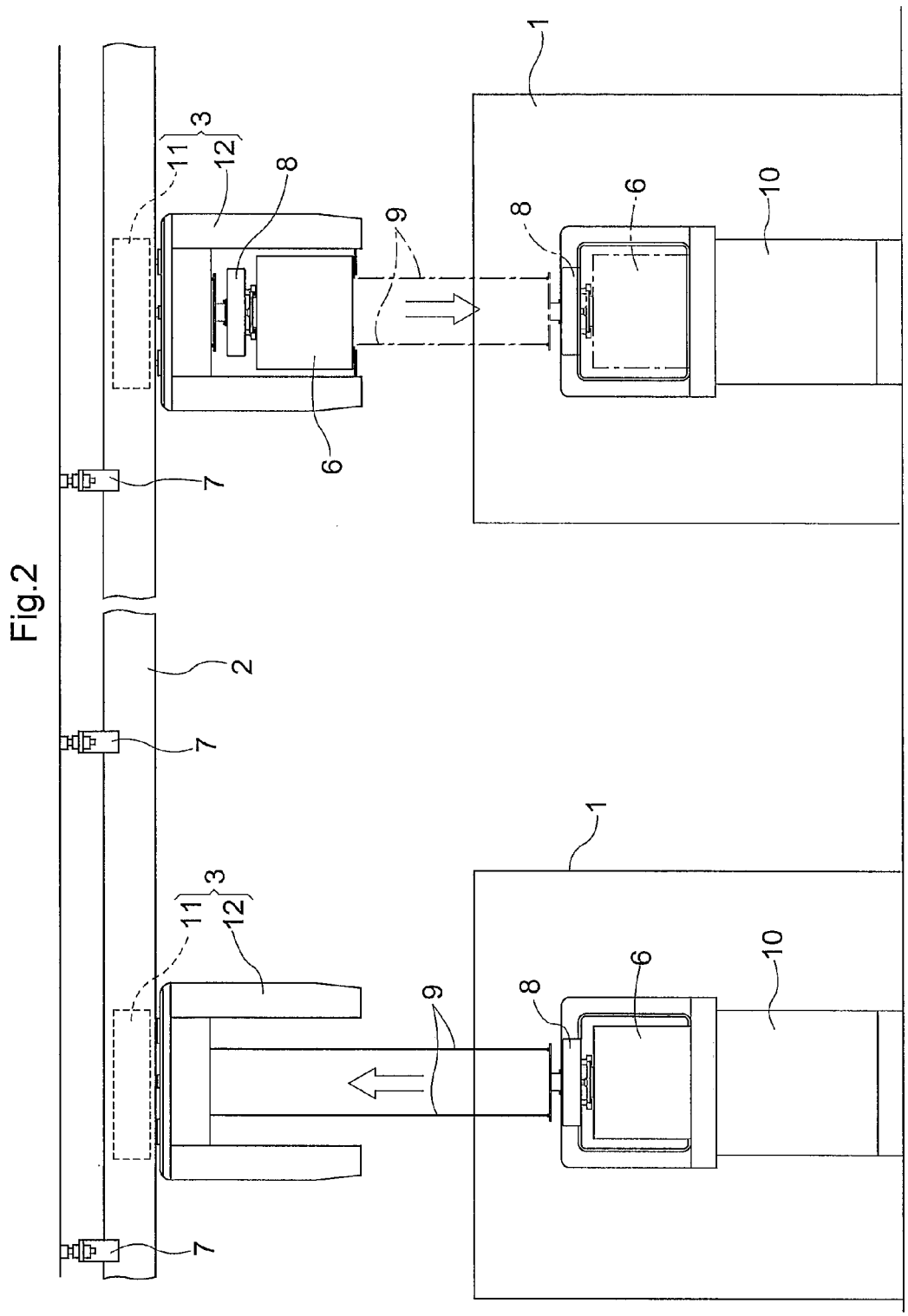
FIG. 2 is a side view of a part of the article transport facility.

As shown in FIGS. 1 and 2, this article transport facility includes travel path S that are defined by travel rails 2 installed on the ceiling side such that they extend by way of or adjacent a plurality of article processors 1, and two or more vehicles 3 (which correspond to the movable bodies) of the ceiling transportation type which can travel in one direction along the travel path S. The travel path S along which the vehicles 3 travel include a loop-shaped primary path 4 in which straight portions and curved portions are connected together, and second paths 5 each of which merges into or joins a straight portion of the primary path 4 after breaking off from the straight portion of the primary path 4. And each of the first paths 4 and the second paths 5 extend by way of or adjacent the article processors 1. In this article transport facility, an article 6 is a container for storing semiconductor substrates and the vehicles 3 are configured to transport articles 6 among the plurality of article processors 1. Each travel rail 2 is fixedly installed to the ceiling by means of travel rail brackets 7.

As shown in FIG. 2, the vehicles 3 has a grip portion 8 which suspends and grips an article 6 and which can be moved vertically. With the vehicle 3 standing still, the grip portion 8 can be moved by feeding out or spooling wires 9 (this does not have to be limited to wires, but belts, for example, can be used instead) between a raised position at which the grip portion 8 is positioned close to the vehicle 3 and a lowered position for article transfer to or from an article transfer station 10 installed at a location lower than the vehicle 3.

Incidentally, FIG. 2 shows a case where the grip portion 8 is lowered to the lowered position from the raised position on one side of the figure, and a case where the grip portion 8 is raised from the lowered position to the raised position on the other side of the figure.

The station 10 consists of a support platform for receiving and supporting an article 6. And the station 10 is provided to receive from the vehicle 3 articles 6 to which a predetermined process is to be performed by the article processor 1, and to deliver to the vehicle 3 articles 6 to which the predetermined process has been performed by the article processor 1. A station 10 is located in correspondence with each of the plurality of article processors 1.

The vehicle 3 is configured to move along the travel rail 2 with the grip portion 8 being located in the raised position, and to transfer an article 6 to or from the station 10 by raising and lowering the grip portion 8 between the raised position and the lowered position with the vehicle 3 stopped at a stop position corresponding to a transfer target station 10 among the plurality of stations 10.

The vehicle 3 is configured to include a travel drive portion 11 which travels on the travel rail 2, and an article support portion 12 suspended and supported by the travel drive portion 11 such that article support portion 12 is located below the travel rail 2.

Figure 3:
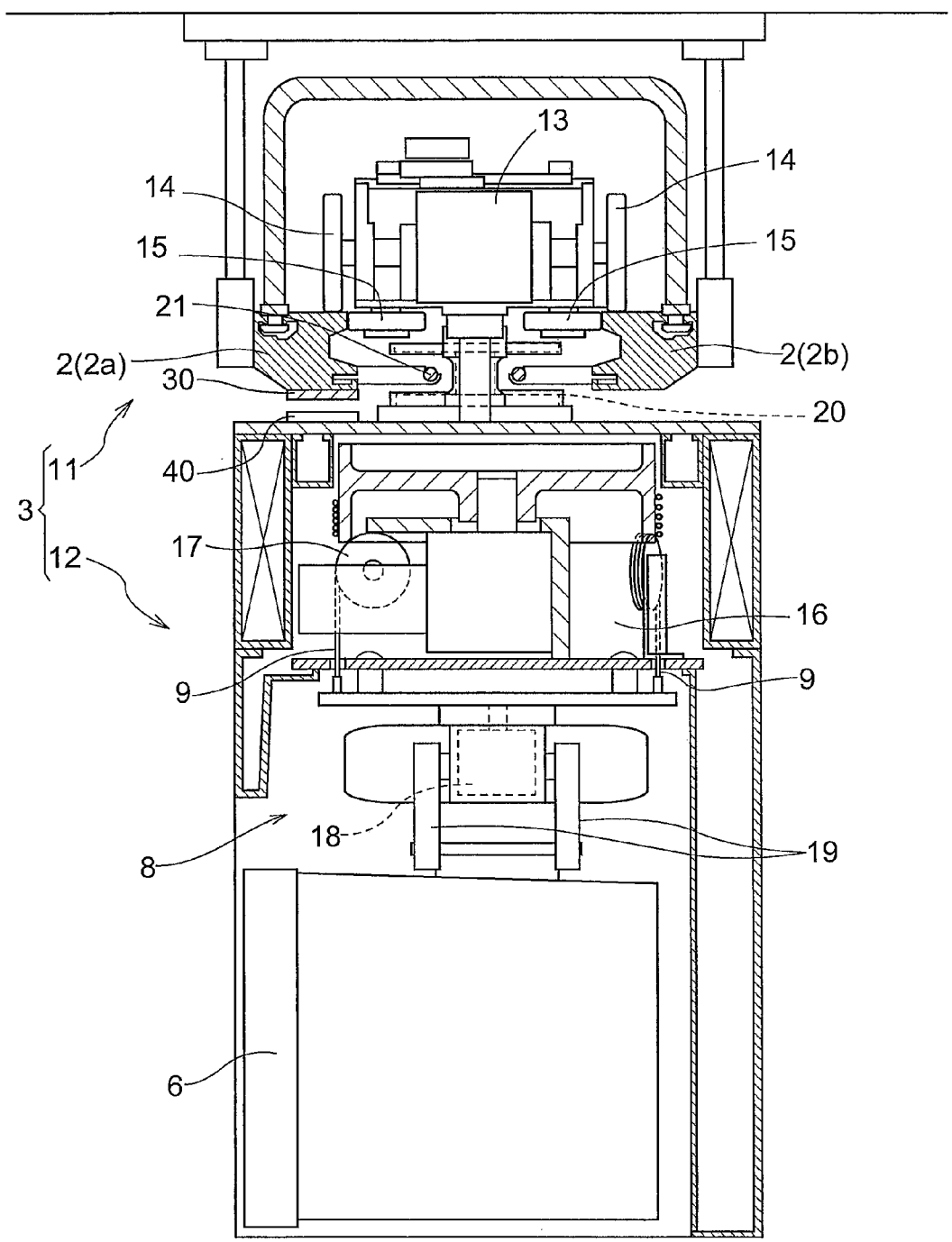
FIG. 3 is sectional drawing of a vehicle as seen in a direction along its travel path.

As shown in FIG. 3, the travel drive portion 11 includes a pair of driven wheels 14 which are driven and rotated by a drive motor 13 and each of which rolls on an upper surface of corresponding one of a pair of rail portions 2a, 2b, and a pair of guiding wheels 15 which can rotate freely and which are in contact with side faces of the pair of rail portions 2a, 2b that face each other. And the vehicle 3 is configured to travel while it is guided by the travel rail 2 by virtue of the fact that the driven wheels 14 are rotated by the drive motor 13 and the guiding wheels 15 are in contact with and guided by the pair of rail portions 2a, 2b.

The article support portion 12 includes rotatable drums 17 which spool wires 9 and which are rotated by a vertical movement motor 16, and a grip portion 8 suspended and supported by the wires 9. The grip portion 8 includes a gripper 19 which can be switched by a gripper motor 18 between a gripping attitude in which an article 6 is gripped, and a grip release attitude in which the grip is released. And the rotatable drums 17 are rotated by the vertical movement motor 16 to raise and lower the grip portion 8 and an article 6 gripped thereby. And the article 6 is gripped and the gripping of the article 6 is released by switching of the gripper 19 by the gripper motor 18.

The power receiving coil 20 is provided to the vehicle 3 such as to be located between the pair of rail portions 2a, 2b. Alternating current is applied to electricity supply lines 21 arranged along the travel rail 2 to generate magnetic field. And the electric power required by the vehicle 3 is generated by a power receiving coil 20 with this magnetic field; thus, the electric power is contactlessly supplied to the vehicle 3. Incidentally, the electricity supply lines 21 are supported by the travel rail 2 such that they are located between the pair of rail portions 2a, 2b.

With regard to the travel of the plurality of vehicles 3, a facility management computer which manages or controls operations of the plurality of vehicles 3 over the entire travel paths S is provided. And a carriage controller having travel control means 22 (see FIG. 4) which controls traveling of the vehicle 3 based on operation command information from the facility management computer is provided to each vehicle 3. The computer, control means, and managing means that are described in this specification belong to the conventional technology, and include a CPU, memory, a communication unit, etc. And algorithms for performing the functions described in the present specification are stored in the memory.

Although illustration is omitted, the vehicles 3 include various sensors such as a stop plate detection sensor for detecting stop plates which are installed, for example, to one side of and close to the travel rail 2 and which indicate a target stop position corresponding to each station 10, an absolute position plate detection sensor for detecting absolute position plates which indicate the positions (distance) from a reference point of the travel path S and which are installed, for example, to one side of and close to the travel rail 2, and a covered-distance sensor for detecting the distance covered by the vehicle 3. The travel control means 22 knows or keeps track of the current position of the vehicle 3 on the travel path S based on detected information from the absolute position plate detection sensor and on detected information from the covered-distance sensor after detecting an absolute position, and transmits the current position information and carriage identification information such as a carriage number which can be used to identify the vehicle among the plurality of vehicles 3 to the facility management computer by wireless communication, etc.

The facility management computer manages or controls the operations of the plurality of vehicles 3 while managing each current position of a plurality of vehicles 3 based on the current position information from each travel control means 22 and the carriage identification information. The facility management computer is configured to select one vehicle 3 for a transporting task from among the plurality of vehicles 3, and to generate a transport command, as operation command information, in which a station 10 is specified as a transport origin and a station 10 is specified as a transport destination from the plurality of stations 10, for transporting an article 6 from the station 10 specified as the transport origin to the station 10 specified as the transport destination and to issue the transport command to the selected vehicle 3. Thus, the travel control means 22 of the vehicle 3 which received the transport command controls the travel of the vehicle 3 to cause it to travel to the station 10 specified as the transport origin based on the detected information from the various sensors, and the carriage controller controls the vertical movement operation of the grip portion 8 and the switching operation of the grip portion 8 to receive an article 6 from the station 10 specified as the transport origin. Thereafter, the travel control means 22 controls the traveling of the vehicle 3 to cause it to travel to the station 10 specified as the transport destination based on the detected information from the various sensors. And the article 6 is delivered to the station 10 specified as the transport destination under the control of the carriage controller.

Figure 4:
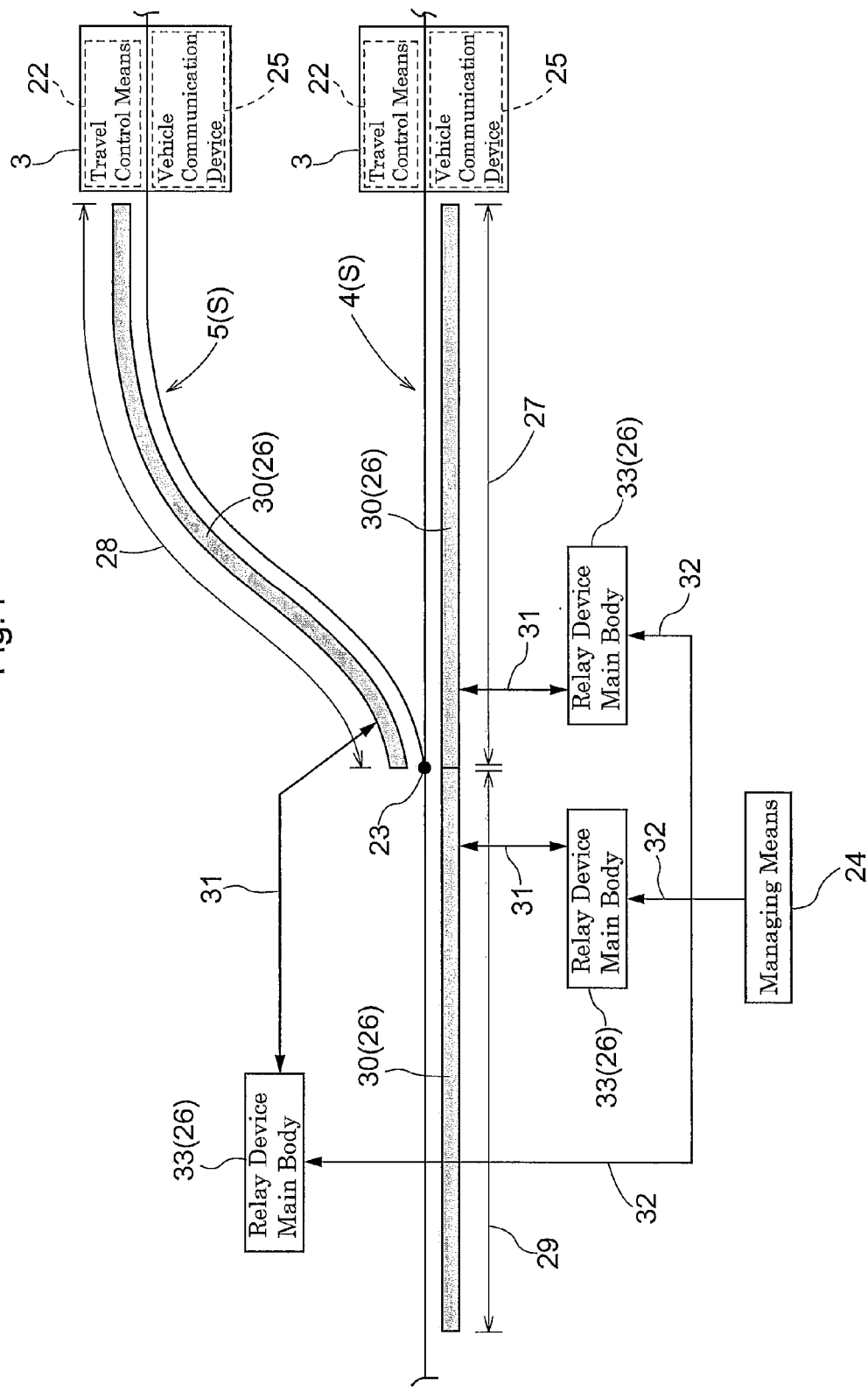
FIG. 4 is a drawing showing a configuration for managing the operations of the movable bodies at the merging portion.

Although the operations of the vehicles 3 on the travel path S are basically managed or controlled by the facility management computer as described above, since at a merging portion 23 at which the secondary path 5 (which corresponds to the second path) joins or merges into the primary path 4 (which corresponds to the first path) as shown in FIG. 1, the vehicles 3 may collide with each other if the vehicles 3 are allowed to merge from both the primary path 4 and the secondary path 5 into the merging portion 23, it is necessary to manage or control operations of the vehicles 3 such that the vehicles 3 are allowed to merge into the merging portion 23 while preventing a collision of vehicles 3 with each other. To this end, the article transport facility in accordance with the present invention includes managing means 24 which manages or controls operations of a plurality of vehicles 3 at the merging portion 23 and which is provided separately from the facility management computer, as shown in FIG. 4.

In order to transfer information between the managing means 24 and the travel control means 22 of each vehicle 3, a communication relay device 26 is provided which communicates wirelessly with a vehicle communication device 25 (which corresponds to a movable body communication device) of each of the plurality of vehicles 3. The managing means 24 issues operation command information to each of the plurality of vehicles 3 through wireless communication between the communication relay device 26 and the vehicle communication device 25. The travel control means 22 provided to each of the plurality of vehicles 3 controls traveling of the vehicle 3 based on the operation command information from the managing means 24 and received by the vehicle communication device 25. And while the vehicle is traveling in the first merging path 27 extending from the primary path 4 to the merging portion 23, or the second merging path 28 extending from the secondary path 5 to the merging portion 23, or the post-merging path 29 which contains the merging portion 23 subsequent to merging at the merging portion 23, the travel control means 22 is configured to transmit movable body information (for example, carriage identification information such as a carriage number which can identify the vehicle) to the communication relay device 26 by means of the vehicle communication device 25.

[Communication Relay Device]

It is not that only one communication relay device 26 is installed or provided at the merging portion 23 but that a separate communication relay device 26 is provided to and for each of the first merging path 27 extending from the primary path 4 to the merging portion 23, the second merging path 28 extending from the secondary path 5 to the merging portion 23, and the post-merging path 29 which includes the merging portion 23 and extends after the merging at the merging portion 23 with a total of three communication relay devices 26.

Each of the communication relay devices 26 includes an antenna portion 30 that is located along corresponding one of the first merging path 27, the second merging path 28, and the post-merging path 29 and that can wirelessly communicate with a vehicle communication devices 25 to exchange information therewith, and a relay device main body 33 which is connected with the antenna portion 30 through a communication line 31 and which can communicate with the managing means 24 to exchange information through a communication line 32.

[Antenna Portion]

As shown in FIGS. 4 and 5, the antenna portion 30 is a sheet-shaped antenna that is formed to be long so as to extend along the path and to have a sheet-shape and a flat plate shaped cross-section and that forms a communication enabled region that extends in the direction of its thickness over the entire surface. Here, the term "long" means that its dimension in the width direction which is perpendicular to its longitudinal direction is substantially less than its total length in the longitudinal direction. And the total length is preferably equal to or greater than twice or more preferably five times its width. Furthermore, "flat plate shape" means that the dimension (i.e., thickness) in the thickness direction which is perpendicular to both the longitudinal direction and the width direction is substantially less than the width. And the width is preferably equal to or greater than twice the thickness and is more preferably equal to or greater than five times the thickness. As described in detail below, the antenna portion 30 transmits wireless signals in two dimensional directions, forms a communication enabled area which is capable of wireless communication along the surface, and outputs power with the communication enabled area along the thickness direction being formed over the entire surface. Incidentally, as the communication protocol when communicating via wireless signal, the communication is performed based on the standard telecommunications protocol (IEEE802.11a), identical to a common wireless LAN.

The antenna portion 30 includes a conductor portion 34 which is a mesh-shaped conductor, a dielectric portion 35 which is a sheet-shaped dielectric, and a conductor portion 36 which is a sheet-shaped conductor, which are laid on top of one another in that order. And a sheet-shaped insulator portion 37, or 38 which consists of an insulator is provided on the outer surface of the mesh-shaped conductor portion 34 and on the back side of the sheet-shaped conductor portion 36. As such, the antenna portion 30 is formed to have a sheet shape as a whole with the sheet-shaped insulator portion 37, the mesh-shaped conductor portion 34, the sheet-shaped dielectric portion 35, the sheet-shaped conductor portion 36, and the sheet-shaped insulator portion 38 being laminated and laid on top of one another in that order and bonded to each other.

As the sheet-shaped dielectric portion 35, dielectric material is used that has the dielectric constant that is greater than that of the air in the frequency band or range used for signal transmission, the magnetic permeability that is approximately equal to that of the air, and the transmission speed of the electromagnetic waves that is less than that in the air. That is, because the speed of the electromagnetic waves, which are an example of a wireless signal, is determined by the product of the magnetic permeability and the dielectric constant, the speed of the electromagnetic waves that propagate within the sheet-shaped dielectric portion having the dielectric constant that is greater than that of the air and the magnetic permeability that is approximately equal to that of the air is less than the speed of the electromagnetic waves that propagate in the air. In addition, many openings 39 are formed in the mesh-shaped conductor portion 34.

When signals corresponding to the wireless signal are applied through the connection line 31, and when the antenna portion 30 transmits the electromagnetic waves, which are an example of the wireless signal, to the front of the sheet-shaped dielectric portion 35 with the magnetic field parallel to the bottom, the electromagnetic field resulting from the electromagnetic waves is formed only close to the surface of the sheet-shaped dielectric portion 35. This is called an evanescent wave. The evanescent wave attenuates exponentially in the direction perpendicular to the front of the sheet-shaped dielectric portion 35, and no significant electromagnetic field is formed except in proximity to the surface.

To describe in more detail, although the electromagnetic waves transmitted to the sheet-shaped dielectric portion 35 propagate within the sheet-shaped dielectric portion 35 in two dimensions, i.e. in concentric circles, the electromagnetic waves leak to the surface through the openings 39 of the mesh-shaped conductor portion 34 during the propagation. During this time, electromagnetic waves are damped exponentially in the direction perpendicular to the front of the sheet-shaped dielectric portion 35, and no significant electromagnetic field is formed except in proximity to the surface. Therefore, the antenna portion 30 transmits wireless signals in two dimensional directions, and forms a wireless-communication enabled area along the surface.

And, as opposed to the case where the electromagnetic waves propagate in the sheet-shaped main body portion 35 of the antenna, when electromagnetic field is formed in the antenna portion 30, electromagnetic waves in the electromagnetic field can be detected and transmitted to the relay device main body 33 through the connection line 31.

As shown in FIG. 3, the front side of the antenna portion 30 is, for example, pasted on the undersurface of the rail portion 2a so that the front side faces downward to form the electromagnetic field downwardly. And a vehicle side antenna portion 40 of the vehicle communication device 25 is provided on the upper surface of the article support portion 12 of the vehicle 3 at a location that faces the antenna portion 30. As such, wireless communication is performed between the communication relay device 26 and the vehicle communication device 25 by exchanging electromagnetic waves between the antenna portion 30 and the vehicle side antenna portion 40.

[Relay Device Main Body]

As shown in FIG. 4, the relay device main body 33 is configured to associate the movable body information (for example, carriage identification information, including the carriage number with which a vehicle can be identified) obtained using the antenna portion 30 through communication with the movable body communication devices 25 with identification information (for example, an antenna number) that indicates which one of the first merging path 27, the second merging path 28, and the post-merging path 29 the antenna portion 30 that received movable body information is provided to and to communicate the information to the managing means 24. For example, if the movable body information is obtained by the antenna portion 30 provided to the first merging path 27, the relay device main body 33 connected to the antenna portion 30 by the connection line 31 transmits the movable body information (carriage identification information) and identification information (for example, antenna identification information, including the antenna number etc.) to the managing means 24 through the communication line 32.

[Managing Means]

The managing means 24 is configured to determine in which path among the first merging path 27, the second merging path 28, and the post-merging path 29, a vehicle 3 exists based on the movable body information and identification information which are received from a relay device main body 33 to manage or control the operations of the plurality of vehicles 3.

Figure 6:
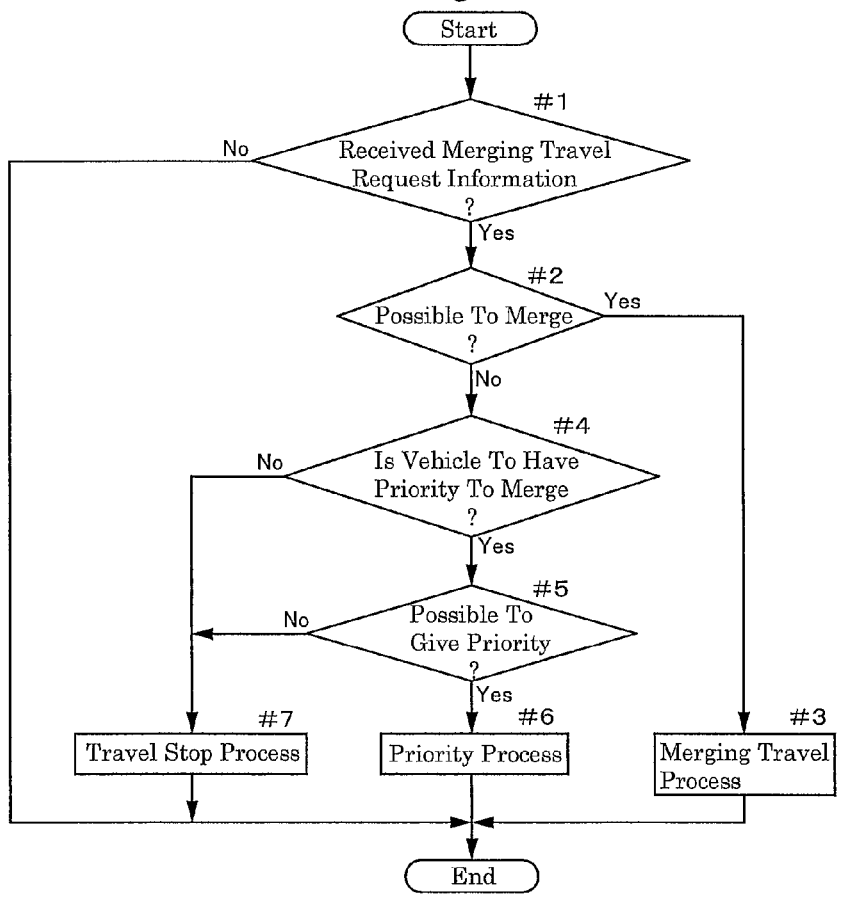
FIG. 6 is a flow chart that shows operations of the managing means.

The operations of the plurality of vehicles 3 as they are managed or controlled by the managing means 24 is described next with reference to the state of the vehicle 3 at the merging portion 23 as shown in FIG. 4, and to the flow charts in FIG. 6 and FIG. 7.

When the vehicle enters the first merging path 27 or the second merging path 28, the travel control means 22 provided to the vehicle 3 temporarily stops the vehicle 3 and causes the vehicle communication device 25 to generate merging travel request information for requesting a merging travel into the merging portion 23 from the primary path 4 or the secondary path 5 as movable body information in addition to such information as the carriage identification information, and transmits same to the communication relay device 26. At this point, since the travel control means 22 knows the current position of the vehicle 3, it can determine from this current position whether the vehicle entered the first merging path 27 or the second merging path 28. Also, the determination of whether the vehicle entered the first merging path 27 or the second merging path 28, for example, may be made by allowing the vehicle communication device 25 and the communication relay device 26 to communicate with each other wirelessly.

Thus, when the vehicle 3 enters either the first merging path 27 or the second merging path 28, information which includes the carriage identification information and the merging travel request information as movable body information is transmitted from the travel control means 22 provided to the vehicle 3 to the managing means 24.

When the managing means 24 receives the merging travel request information, the managing means 24 can recognize whether it is the first merging path 27 or the second merging path 28 that the vehicle 3 entered because it receives the merging travel request information and the identification information (for example, antenna identification information, including the antenna number etc.). Thus, as shown in FIG. 3, when the merging travel request information is received, the managing means 24 determines whether the merging travel of the vehicle 3 is possible (step #1, #2).

Since if a vehicle 3 exists in the first merging path 27, the second merging path 28, or the post-merging path 29, the managing means 24 receives the movable body information and identification information (for example, antenna identification information, including the antenna number etc.) from the vehicle 3, the managing means 24 can determine if other vehicle 3 exists in the path to be traveled during the merging travel and if there is a vehicle 3 that was caused to start the merging travel earlier. Here, the path in which the vehicle is to travel during the merging travel consists of the first merging path 27 and the post-merging path 29 when it is the first merging path 27 that the vehicle 3 entered, and of the second merging path 28 and the post-merging path 29 when it is the second merging path 28 that the vehicle 3 entered.

If the managing means 24 determines that no other vehicle 3 exists in the path to be traveled during the merging travel and that there is no vehicle 3 that was caused to start the merging travel earlier, the managing means 24 determines that the merging travel is possible and performs a merging travel process (step #3).

Although the merging travel is determined to be possible if it is determined that no other vehicle 3 exists in the path to be traveled during the merging travel and there is no vehicle 3 that had been caused to start the merging travel earlier, the merging travel can also be determined to be possible, for example, if it is determined that no other vehicle 3 exists in the path to be traveled during the merging travel. Thus, a subsequent vehicle 3 can be allowed to enter the first merging path 27 or the second merging path 28 before a vehicle 3 completes its merging travel while preventing a collision with the vehicle 3 that was caused to start the merging travel earlier; therefore, it is possible to allow a plurality of vehicles 3 to merge smoothly and efficiently.

As the merging travel process, the managing means 24 generates a merging travel command as operation command information for allowing the merging travel and issues the command to the vehicle 3 which transmitted merging travel request information. This causes the travel control means 22 provided to the vehicle 3 that transmitted the merging travel request information to cause the vehicle 3 to start traveling and to merge. In addition, the managing means 24, as the merging travel process, generates a passage entry prohibition command for preventing entry into the path to be traveled and issues it to the other vehicle 3 to prevent the other vehicle 3 from colliding with the vehicle 3 that is merging. This causes the travel control means 22 provided to the other vehicle 3 to extend or continue with the temporary interruption of travel after entering the first merging path 27 or the second merging path 28, thus, preventing a collision between the vehicles 3.

The managing means 24 determines that the merging travel is not possible if another vehicle 3 exists in the path to be traveled or if there is a vehicle 3 that was caused to start the merging travel earlier, and determines if the vehicle 3 that transmitted the merging travel request information is the vehicle 3 that should be given priority to merge (step #4). Here, for example, the vehicle 3 that travels in the primary path 4 may be given priority to merge over the vehicle 3 that travels in the secondary path 5. Also, the vehicle whose destination station 10 is farther from the merging portion 23 in the travel direction than the destination station 10 of a vehicle 3 that was caused to start the merging travel earlier may be given priory to merge. In this case, since the managing means 24 needs to manage or keep track of the location of the destination station 10 of the vehicle 3, the travel control means 22 transmits information including station number, etc. which indicates the destination station 10 as movable body information to the communication relay device 26 through the vehicle communication device 25 when the vehicle 3 enters the first merging path 27 or the second merging path 28.

If the managing means 24 determines that the vehicle 3 that transmitted the merging travel request information is the vehicle 3 that should be given priority to merge, the managing means 24 determines whether it is possible to allow the vehicle 3 that had been determined to be given priority to merge first depending on whether the vehicle 3 that was caused to start the merging travel earlier has reached the merging portion 23 (step #5). Since the travel control means 22 provided to the vehicle 3 that was caused to start the merging travel earlier has transmitted the vehicle information to the communication relay device 26 through the vehicle communication device 25, the managing means 24 knows which path the vehicle 3 that was caused to start the merging travel earlier exists in. Thus, the managing means 24 determines whether it is possible to allow the vehicle 3 that had been determined to be given priority to merge first if the vehicle 3 that was caused to start the merging travel earlier has not reached the merging portion 23, or if the vehicle 3 that had been determined to be given priority to merge would not collide—if it is allowed to merge—with the vehicle 3 that was caused to start the merging travel earlier.

The priority process will be performed if the managing means 24 determines that priority may be given to the vehicle 3 (step #6). As the priority process, the managing means 24 generates a travel stop command for causing the vehicle 3 to stop traveling as operation command information, and issues it to the vehicle 3 which started the merging travel earlier. Thereby the travel control means 22 provided to the vehicle 3 that started the merging travel earlier causes the vehicle 3 to stop traveling. In addition, as the priority process, the managing means 24 generates a merging travel command as operation command information, and issues it to the vehicle 3 that was given priority to merge. Thereby the travel control means 22 provided to the vehicle 3 vehicle 3 that was given priority to merge causes the vehicle 3 to start traveling and to merge. Thus, when there is a vehicle that was caused to start the merging travel earlier, and if there is a vehicle 3 that has priority over such vehicle to merge enters the first merging path 27 or the second merging path 28, the vehicle that was caused to start the merging travel earlier is stopped so that the vehicle 3 that has the priority can merge provided that a collision between the vehicles 3 can be prevented.

If the merging travel is determined to be not possible in step #2, the managing means 24 performs the travel stop process (step #7) if the vehicle 3 that transmitted the merging travel request information is not the vehicle 3 that was given priority to merge in step #4 or if it is determined that the priority can not be given in Step 5. As the travel stop process, the managing means 24 generates a merging travel prohibition command for prohibiting a merging travel as operation command information, and issues it to the vehicle 3 that transmitted the merging travel request information. Thereby, the travel control means 22 provided to the vehicle 3 that transmitted the merging travel request information keeps the vehicle 3 from traveling, thus preventing the collision between the vehicles 3.

Figure 7:
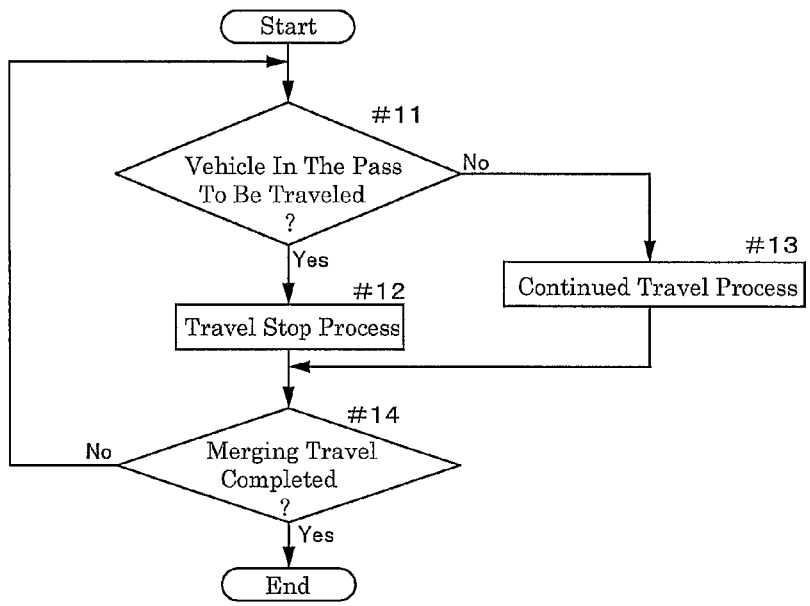
FIG. 7 is a flow chart that shows operations of the managing means.

And, as shown in the flow chart in FIG. 7, the managing means 24 monitors whether any vehicle 3 exists in the path to be traveled by the vehicle 3 which was caused to start a merging travel (step #11). If any other vehicle 3 exists in the path to be traveled, the managing means 24 knows which path the vehicle 3 exists in based on the movable body information and the identification information (antenna identification information) because the travel control means 22 provided to the vehicle 3 transmits the movable body information to the communication relay device 26 by the vehicle communication device 25. Thus, the managing means 24 can determine whether any other vehicle 3 exists in the path to be traveled by the vehicle 3 which was caused to start a merging travel.

If the managing means 24 determines that a vehicle 3 exists in the path to be traveled, it performs the travel stop process in which it generates a travel stop command for causing the vehicle 3 to stop traveling as operation command information, and issues it to the vehicle 3 which was caused to start a merging travel (step #12). If the managing means 24 determines that no vehicle 3 exists in the path to be traveled, it performs a continued travel process in which it issues a continued travel command for causing the vehicle 3 to continue traveling as operation command information to the vehicle 3 which was caused to start a merging travel (step #13). In this manner, the managing means 24 monitors whether a vehicle 3 exists in the path to be traveled until it determines that the merging travel was completed by virtue of the fact that the managing means 24 stops receiving the movable body information from the vehicle 3 which was caused to start a merging travel because the vehicle has completed traveling in the post-merging path 29, and the managing means 24 performs either the travel stop process or the continued travel process (step #14). When a vehicle 3 was caused to start a merging travel and is performing the merging travel, even if a vehicle 3 was caused to enter the path to be traveled, for example, manually, the vehicle 3 is stopped, thus preventing a collision between the vehicles.

When the managing means 24 stops the vehicle 3 which was caused to start a merging travel because a vehicle 3 exists in the path to be traveled, the managing means 24 can allow the vehicle 3 to complete traveling though the post-merging path 29 by generating and issuing operation command information for causing the vehicle 3 to complete traveling through the post-merging path 29 to the vehicle 3 which exists in the path to be traveled. In this manner, the managing means 24 then determines that no vehicle 3 exists in the path to be traveled and performs the continued travel process to the vehicle 3 which was caused to stop to restart the merging travel.

Second Embodiment

Because this second embodiment is an alternative embodiment for the installation locations of the communication relay devices 26 of the first embodiment, and because other configurations are identical to those in the first embodiment, only the different aspects of the configuration will be described.

As shown in FIG. 8, in this second embodiment, each of the first merging path 27, the second merging path 28, and the post-merging path 29 is divided into a plurality of divided path portions 41. And the communication relay device 26 is individually provided to each of the divided path portions 41.

The relay device main body 33 is configured to associate the movable body information obtained using the antenna portion 30 through communication with the vehicle communication device 25 with division identification information (for example, a division number of the divided path portion) that indicates which one of the divided path portions 41 the antenna portion 30 that received the movable body information is provided to and to communicate the information to the managing means 24.

Thereby, the managing means 24 is configured to determine which one of the plurality of divided path portions 41 the vehicle 3 exists in based on the movable body information and the division identification information (for example, division number of the divided path portion) received from the relay device main body 33, and to generate the operation command information based on this determination to manage or control operations of the plurality of vehicles 3.

Because, if a vehicle 3 is located in any of the plurality of divided path portions 41, the travel control means 22 provided to the vehicle 3 transmits the movable body information to the communication relay device 26 through the vehicle communication device 25, the relay device main body 33 of the communication relay device 26 transmits the movable body information and the division identification information (for example, division number of the divided path portion) to the managing means 24. Since the managing means 24 is capable of recognizing which one of the plurality of divided path portions 41 a vehicle 3 exists in, the managing means 24 can prevent collisions between the vehicles 3 by generating entry prohibition command information which prohibits entry into the divided path portion 41 in which a vehicle 3 exists as operation command information, and by issuing it to each of the vehicles 3 even if two or more vehicles 3 are caused to enter each of the first merging path 27, the second merging path 28, and the post-merging path 29. This makes it possible to allow a plurality of vehicles 3 to perform a merging travel while allowing the vehicles 3 to be closer together; thus, a plurality of vehicles 3 can be allowed to perform the merging travel efficiently.

The operations shown in the flow chart shown in FIG. 9 may be performed in lieu of the operations, for example, as shown in the flow chart in FIG. 7 in the first embodiment in which whether the vehicle 3 exists in the path to be traveled by the vehicle 3 which was caused to merge is monitored.

If the managing means 24 determines that there is a divided path portion 41 in which a vehicle 3 exists, it performs an entry prohibition process in which the managing means 24 generates an entry prohibition command information which prohibits entry into the divided path portion 41 as operation command information, and issues it to the vehicle 3 which was caused to start a merging travel (steps #21, and #22). If the managing means 24 determines that there is no divided path portion 41 in which a vehicle 3 exists, it performs a continued travel process in which it generates a continued travel command for causing the vehicle 3 to continue traveling as operation command information to the vehicle 3 which was caused to start the merging travel (step #23).

When a vehicle 3 enters the first merging path 27 or the second merging path 28, and even if there is a vehicle that was caused to start the merging travel earlier, the travel control means 24 may generate, as operation command information, a passed entry permission command which permits entry into the divided path portion 41 which the vehicle 3 has already passed, and may issue it to the vehicle 3 that entered the first merging path 27 or the second merging path 28. Thus, the vehicle 3 that is to merge next can be allowed to enter the first merging path 27 or the second merging path 28 before the vehicle 3 that was caused to merge earlier completes the merging travel; thus, a plurality of vehicles 3 may be allowed to merge efficiently and smoothly.

Alternative Embodiments (1) Although examples in which the article transport facility in accordance with the present invention is applied to the facility having vehicles 3 of the ceiling transporting type were disclosed in the first and second embodiments described above, the application of the facility is not limited to this and the facility may be applied to a facility having vehicles that travel on the ground.

(2) Although, the first merging path 27, the second merging path 28, and the post-merging paths 29 are all divided into a plurality of divided path portions 41 in the second embodiment described above, only the first merging path 27 and the second merging path 28, for example, may be divided into a plurality of divided path portions 41. What is preferable is to have at least one of the first merging path 27, the second merging path 28, and the post-merging paths 29 divided into a plurality of divided path portions 41.

INDUSTRIAL APPLICABILITY

The article transport facility may be used as a facility in which articles are transported in a warehouse, or a processing facility, etc.

DESCRIPTION OF THE REFERENCE NUMERALS AND SYMBOLS

3 Movable Body (Vehicle)
4 First Path (Primary Path)
5 Second Path (Secondary Path)
22 Travel Control Means
23 Merging Portion
24 Managing Means
25 Mobile Body Communication Device (Vehicle Communication Device)
26 Communication Relay Device
27 First Merging Path
28 Second Merging Path
29 Post-merging Path
30 Antenna Portion
31 Connection Line
32 Communication Line
33 Relay Device Main Body
S Travel Path

The invention claimed is:

1. An article transport facility comprising:
a travel path including at least a first path and a second path, the travel path being defined by a rail;
a plurality of movable bodies which travel along the travel path for transporting articles;
a communication relay device for communicating wirelessly with a movable body communication device provided to each of the plurality of movable bodies;
managing device for issuing operation command information to each of the plurality of movable bodies through wireless communication between the communication relay device and the movable body communication device to manage operations of the plurality of movable bodies at a merging portion at which the first path and the second path merge with each other;
wherein each of the plurality of movable bodies includes a travel controller for controlling travel of the movable body based on the operation command information from the managing device received by the movable body communication device, wherein
the communication relay device is individually provided to each of a first merging path that extends from the first path to the merging portion, a second merging path that extends from the second path to the merging portion, and a post-merging path that includes the merging portion and extends subsequent to merging at the merging portion, wherein
each said communication relay device includes an antenna portion that is provided along the first merging path, the second merging path, or the post-merging path and that is capable of communicating information wirelessly with the movable body communication device, and a relay device main body to which the antenna portion is connected through a connection line and which is capable of communicating information with the managing device through a communication line, wherein
the antenna portion is a sheet-shaped antenna that is formed to be long and to have a sheet-shape and a flat plate shaped cross-section and that forms a communication enabled region over an entire surface of the antenna portion wherein the antenna portion is arranged along a longitudinal direction of the rail such that the antenna portion is supported by the rail, wherein
the relay device main body is configured to associate movable body information obtained using the antenna portion through communication with the movable body communication device with identification information that indicates which one of the first merging path, the second merging path, and the post-merging path the antenna portion that received the movable body information is provided to, and to communicate information thus obtained to the managing device, and wherein the managing device is configured to determine which one of the first merging path, the second merging path, and the post-merging path the movable body exists in, based on the movable body information and the identification information which are received from the relay device main body to control operations of the plurality of movable bodies.

2. The article transport facility as defined in claim 1, wherein
when the movable body to which the travel controller is provided enters the first merging path or the second merging path, the travel controller causes the movable body communication device to transmit merging travel request information for requesting a merging travel into the merging portion from the first path or the second path to the communication relay device, and wherein
when the managing device receives the merging travel request information, if the managing device determines that no other movable body exists in the path to be traveled during the merging travel and that there is no movable body which was caused to start a merging travel earlier, the managing device is configured to issue a merging travel command for commanding a merging travel as the operation command information to the movable body that transmitted the merging travel request information, and to issue a passage entry prohibition command for prohibiting entry into the path to be traveled to another movable body as the operation command information, wherein if the managing device determines that a movable body exists in the path to be traveled during the merging travel or that there is a movable body which was caused to start a merging travel earlier, the managing device is configured to issue a merging travel prohibition command which prohibits a merging travel to the movable body that transmitted the merging travel request information as the operation command information.

3. The article transport facility as defined in claim 2, wherein
when a movable body exists that is performing a merging travel, if the managing device determines that another movable body exists in the path to be traveled during the merging travel of the movable body, the managing device is configured to issue a travel stop command for stopping travel as the operation command information to the movable body that is performing the merging travel.

4. The article transport facility as defined in claim 2, wherein
when the movable body that started a merging travel earlier has not reached the merging portion, if the managing device receives the merging travel request information from a movable body that has priority to merge over the movable body that started the merging travel, the managing device is configured to issue a travel stop command for stopping travel as the operation command information to the movable body that started the merging travel earlier and to issue a merging travel command as the operation command information to the movable body that has priority to merge.

5. The article transport facility as defined in claim 1, wherein
at least one of the first merging path, the second merging path, and the said post-merging paths is divided into a plurality of divided path portions, wherein
the communication relay device is individually provided to each of the plurality of divided path portions, wherein
the relay device main body is configured to associate movable body information obtained using the antenna portion through communication with the movable body communication device with division identification information that indicates which one of the divided path portions the antenna portion that received the movable body information is provided to, and to communicate information thus obtained to the managing device, and wherein
the managing device is configured to determine which one of the divided path portions the movable body exists in, based on the movable body information and the division identification information which are received from the relay device main body to control operations of the plurality of movable bodies.

6. The article transport facility as defined in claim 5, wherein
the managing device is configured to issue an entry prohibition command for prohibiting entry into the divided path portion in which the movable body exists as the operation command information to each of the plurality of movable bodies.

7. The article transport facility as defined in claim 1, wherein
the rail is supported by a ceiling, wherein
the movable body includes a travel drive portion configured to travel along the rail, and an article support portion supported by the travel drive portion such that the article support portion is located below the rail, wherein
the antenna portion is located on a surface that faces the article support portion of the rail, and wherein
a vehicle side antenna portion which communicates with the antenna portion is provided to the article support portion.

8. An article transporting method for an article transport facility that includes:
a travel path including at least a first path, a second path, and a merging portion at which the first path and the second path merge with each other, the travel path being defined by a rail;
a plurality of movable bodies which are configured to travel along the travel path to transport articles, and each of which includes a vehicle communication device and a travel controller;
managing device for managing operation of each of the plurality of movable bodies in order to manage operations of the plurality of movable bodies at least at the merging portion;
a communication relay device individually provided to each of a first merging path that extends from the first path to the merging portion, a second merging path that extends from the second path to the merging portion, and a post-merging path that includes the merging portion and extends subsequent to merging at the merging portion; wherein each said communication relay device includes an antenna portion that is provided along the first merging path, the second merging path, or the post-merging path and that is capable of communicating information wirelessly with the movable body communication device, and a relay device main body to which the antenna portion is connected through a connection line and which is capable of communicating information with the managing device through a communication line, wherein the antenna portion is a sheet-shaped antenna that is formed to be long and to have a sheet-shape and a flat plate shaped cross-section and that forms a communication enabled region over an entire surface of the antenna portion wherein the antenna portion is arranged along a longitudinal direction of the rail such that the antenna portion is supported by the rail, the article transporting method comprising the steps of:

causing the relay device main body to associate movable body information obtained using the antenna portion through communication with the movable body communication device with identification information that indicates which one of the first merging path, the second merging path, and the post-merging path the antenna portion that received the movable body information is provided to, and to communicate information thus obtained to the managing device;

causing the managing device to determine which one of the first merging path, the second merging path, and the post-merging path the movable body exists in, based on the movable body information and the identification information which are received from the relay device main body, to generate operation command information, and to issue operation command information to at least one of the plurality of movable bodies through wireless communication between the said communication relay device and the said movable body communication device; and causing the travel controller to control travel of at least one of the movable bodies based on the operation command information from the managing device received by the movable body communication device.

9. The article transporting method as defined in claim 8 further comprising the step of:

causing the travel controller to generate merging travel request information for requesting a merging travel from the first path or the second path to the merging portion when the movable body to which the travel controller is provided enters the first merging path or the second merging path, and to transmit the merging travel request information to the communication relay device by the movable body communication device, wherein the step of causing the managing device to issue operation command information includes:

when the managing device receives the merging travel request information, if the managing device determines that no other movable body exists in the path to be traveled during the merging travel and that there is no movable body which was caused to start a merging travel earlier, causing the managing device to issue a merging travel command for commanding a merging travel as the operation command information to the movable body that transmitted the merging travel request information, and to issue a passage entry prohibition command for prohibiting entry into the path to be traveled to other movable bodies as said operation command information, and if the managing device determines that a movable body exists in the path to be traveled during the merging travel or that there is a movable body which was caused to start a merging travel earlier, causing the managing device to issue a merging travel prohibition command which prohibits a merging travel to the movable body that transmitted the merging travel request information as the operation command information.

10. The article transporting method as defined in claim 9, wherein the step of causing the managing device to issue operation command information includes:

when a movable body exists that is performing a merging travel, if the managing device determines that another movable body exists in the path to be traveled during the merging travel of the movable body, causing the managing device to issue a travel stop command for stopping travel as the operation command information to the movable body that is performing the merging travel.

11. The article transporting method as defined in claim 9, wherein the step of causing the managing device to issue operation command information includes:

when the movable body that started a merging travel earlier has not reached the merging portion, if the managing device receives the merging travel request information from a movable body that has priority to merge over the movable body that started the merging travel, causing the managing device to issue a travel stop command for stopping travel as the operation command information to the movable body that started the merging travel earlier and to issue a merging travel command as the operation command information to the movable body that has priority to merge.

12. The article transporting method as defined in claim 8, wherein at least one of the first merging path, the second merging path, and the said post-merging paths is divided into a plurality of divided path portions, wherein the communication relay device is individually provided to each of the plurality of divided path portions, wherein the step of causing the relay device main body to transmit to the managing device includes:

causing the relay device main body to associate movable body information obtained using the antenna portion through communication with the movable body communication device with division identification information that indicates which one of the divided path portions the antenna portion that received the movable body information is provided to, and to communicate information thus obtained to the managing device, and wherein the step of causing the managing device to issue operation command information includes:

causing the managing device to determine which one of the divided path portions the movable body exists in, based on the movable body information and the division identification information which are received from the relay device main body, and to generate the operation control information based on this determination.

13. The article transporting method as defined in claim 12, wherein the step of causing the managing device to issue operation command information includes:

causing the managing device to issue an entry prohibition command for prohibiting entry into the divided path portion in which the movable body exists as the operation command information to each of the plurality of movable bodies.

* * * * *